(12) United States Patent
Ojo et al.

(10) Patent No.: US 8,081,947 B2
(45) Date of Patent: *Dec. 20, 2011

(54) METHOD AND SYSTEM FOR CONFIGURABLE ACTIVE/PASSIVE MIXER AND SHARED GM STAGE

(75) Inventors: Adedayo Ojo, San Diego, CA (US);
Madjid Hafizi, San Diego, CA (US);
Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 322 days.

This patent is subject to a terminal disclaimer.

(21) Appl. No.: 11/618,853

(22) Filed: Dec. 31, 2006

(65) Prior Publication Data

US 2008/0139159 A1 Jun. 12, 2008

Related U.S. Application Data

(60) Provisional application No. 60/868,818, filed on Dec. 6, 2006.

(51) Int. Cl.
*H04B 1/26* (2006.01)
*H04B 15/00* (2006.01)

(52) U.S. Cl. .................. 455/313; 455/323; 455/325

(58) Field of Classification Search .......... 455/312–319, 455/323–326, 333

See application file for complete search history.

(56) References Cited

U.S. PATENT DOCUMENTS

| 5,999,804 | A  | * | 12/1999 | Forgues ...................... 455/333 |
| 6,766,158 | B1 | * | 7/2004  | Molnar et al. ................ 455/323 |
| 7,358,885 | B2 | * | 4/2008  | Maxim et al. ................. 341/144 |
| 7,417,486 | B2 | * | 8/2008  | Koutani et al. ............... 327/359 |
| 7,421,259 | B2 | * | 9/2008  | Gomez et al. ................. 455/130 |
| 7,457,606 | B2 | * | 11/2008 | Kim ............................ 455/323 |
| 7,477,888 | B2 | * | 1/2009  | Behzad ........................ 455/323 |
| 7,493,097 | B2 | * | 2/2009  | Ismail et al. ................. 455/285 |
| 7,512,393 | B2 | * | 3/2009  | Pullela et al. ................ 455/323 |
| 2006/0148438 | A1 | * | 7/2006  | Manku ......................... 455/313 |
| 2007/0218850 | A1 | * | 9/2007  | Pan ............................ 455/189.1 |
| 2007/0264958 | A1 | * | 11/2007 | Lin ............................ 455/318 |
| 2008/0014896 | A1 | * | 1/2008  | Zhuo et al. ................... 455/326 |
| 2008/0132189 | A1 | * | 6/2008  | Maxim et al. ................. 455/280 |
| 2008/0132195 | A1 | * | 6/2008  | Maxim et al. ................. 455/334 |
| 2008/0139162 | A1 | * | 6/2008  | Hafizi ......................... 455/325 |

FOREIGN PATENT DOCUMENTS

| CN | 1133656 A | 10/1996 |
| CN | 1638369   | 7/2005  |
| CN | 1722609   | 1/2006  |

\* cited by examiner

*Primary Examiner* — Simon Nguyen
(74) *Attorney, Agent, or Firm* — McAndrews, Held & Malloy, Ltd.

(57) ABSTRACT

Aspects of a method and system for configurable Active/Passive Mixer and Shared GM Stage may include configuring an RF mixer in frequency demodulator to operate in an active mode or a passive mode. An in-phase (I) processing path and a quadrature (Q) processing path of the RF mixer may utilize a single shared GM stage. One or more switches may be activated to enable the active mode or the passive mode of operation for the RF mixer.

10 Claims, 6 Drawing Sheets

METHOD AND SYSTEM FOR CONFIGURABLE ACTIVE/PASSIVE MIXER AND SHARED GM STAGE

CROSS-REFERENCE TO RELATED APPLICATIONS/INCORPORATION BY REFERENCE

This patent application makes reference to, claims priority to, and claims the benefit of U.S. Provisional Application Ser. No. 60/868,818, filed on Dec. 6, 2006.

This application makes reference to U.S. application Ser. No. 11/618,866 filed on even date herewith.

Each of the above stated applications is hereby incorporated herein by reference in its entirety.

FIELD OF THE INVENTION

Certain embodiments of the invention relate to electronic circuit design and signal processing. More specifically, certain embodiments of the invention relate to a method and system for configurable Active/Passive Mixer and Shared GM Stage.

BACKGROUND OF THE INVENTION

In wireless communication systems, a received radio frequency (RF) signal may be converted to an intermediate frequency (IF), and then from IF to a baseband signal, where the IF may be in the megahertz range. For certain systems, it may also be possible to convert directly from RF to baseband. Generally, the RF signal may be mixed with a local oscillator signal that results in two (double) sideband signals that are the sum of the frequencies of the two signals and the difference of the frequencies of the two signals, where the difference is often called 'beat frequency'. The lower frequency component is typically the signal that is required for further processing of the signal. One of the two sideband signals may be chosen as an IF signal, and this IF signal may be the same for all received RF signals. Therefore, a radio that may receive a plurality of channels, such as a Wireless LAN radio, may tune to a particular frequency corresponding to one of 11 standard channels by changing the local oscillator signal frequency such that the IF remains constant. With a constant IF, most of the receive path may be common in the receiver.

Today, much of radio receiver development may be driven mostly by a great demand for mobile wireless communication devices, including handsets. With the ever-decreasing size of mobile handsets, capacities of smaller batteries may be an issue. As most of these handsets may utilize complementary metal-oxide semiconductor (CMOS) technology for analog-to-digital conversion, and for much of the processing of voice and data signals, a very important factor to consider is that it may be advantageous for CMOS devices to operate at lower frequencies. This may be crucial since CMOS devices have power dissipation directly related to the speed at which the CMOS devices switch. The faster the frequencies, the faster the CMOS device switching speed, and therefore, the greater the amount of power consumed. Therefore, receivers may be designed to downconvert the high frequency RF, which may be in gigahertz range, to a lower frequency, preferably to a baseband frequency, as quickly as possible.

Besides the operation of frequency downconversion, the demodulation circuitry also separates the in-phase (I) channel from the (Q) quadrature channel. The received RF signal may be written as the sum of a component modulated onto a cosine at the carrier frequency and a component modulated onto a sine at the carrier frequency. The component modulating the cosine is termed the in-phase component and the term modulating the sine is termed the quadrature component since the sine wave is equivalent to a cosine wave with a 90 degrees phase shift.

The separation of the channel may be achieved by multiplying the received signal with the local oscillator as described above. The baseband component of this operation may then be processed as the I channel. To obtain the Q channel, the received signal can be multiplied with the local oscillator signal that is phase shifted by 90 degrees.

Another important factor to consider may be the signal integrity in the signal path. Because signals received at a receiver's antenna may be very weak, for example, six millivolts (6 mV), the first component to process the received signal may be a low noise amplifier (LNA) that is designed to amplify signals while adding very little additional noise to the signal being amplified. The amplified signal may be filtered to attenuate undesired signals, amplified further to increase the strength of the signal, and mixed with local oscillator signals to downconvert to lower frequencies. Factors such as process, voltage and temperature (PVT) variations may also result in a DC offset.

Due to limitations on the power consumption, in particular for the mobile communications terminal, it is crucial to minimize the number of components and the die area required for analog RF circuitry. Fewer components, in particular, active components, may also help to keep heat dissipation down and reduce power consumption when the circuits are idle, due to less biasing currents. Also very significant is that certain analog components may take up disproportionate amounts of space on integrated circuits and their use is therefore to be kept to a minimum. Examples are inductors and large capacitors.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for configurable Active/Passive Mixer and Shared GM Stage, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for configurable Active/Passive Mixer and Shared GM Stage. Certain aspects of the invention may comprise configuring an RF mixer in frequency demodulator to operate in an active mode or a passive mode. An in-phase (I) processing path and a quadrature (Q) processing path of the RF mixer may utilizes a single shared GM stage. One or more mixer stages of the RF mixer in the frequency demodulator may be converted from a passive configuration to an active configuration. One or more switches may be activated to enable the active mode or the passive mode of operation for the RF mixer.

Figure 1A:
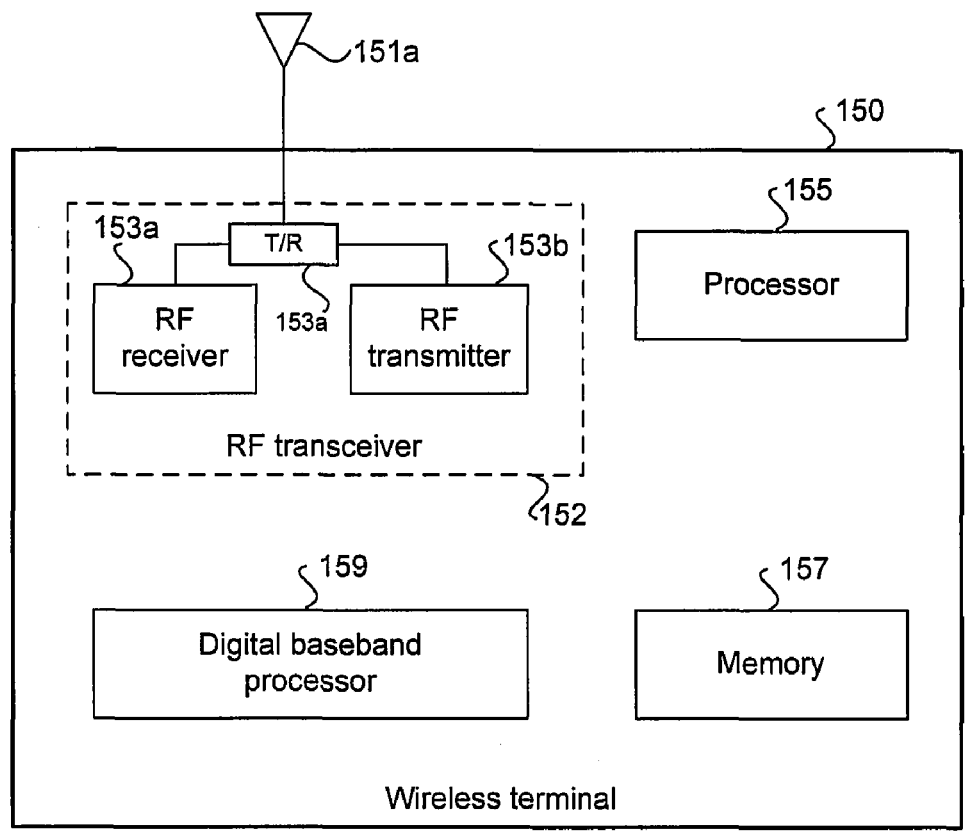
FIG. 1A is a block diagram illustrating an exemplary wireless terminal, in accordance with an embodiment of the invention.

FIG. 1A is a block diagram illustrating an exemplary wireless terminal, in accordance with an embodiment of the invention. Referring to FIG. 1A, there is shown a wireless terminal 150 that may comprise an RF receiver 153a, an RF transmitter 153b, a digital baseband processor 159, a processor 155, and a memory 157. In some embodiments of the invention, the RF receiver 153a and the RF transmitter 153b may be integrated within an RF transceiver 152, for example. A single transmit and receive antenna 151a may be communicatively coupled to the RF receiver 153a and the RF transmitter 153b. A switch or other device having switching capabilities may be coupled between the RF receiver 153a and RF transmitter 153b, and may be utilized to switch the antenna between transmit and receive functions. The wireless terminal 150 may be operated in a system, such as the Wireless Local Area Network (WLAN), a cellular network and/or digital video broadcast network, for example. In this regard, the wireless terminal 150 may support a plurality of wireless communication protocols, including the IEEE 802.11n standard specifications for WLAN networks.

The RF receiver 153a may comprise suitable logic, circuitry, and/or code that may enable processing of received RF signals. The RF receiver 153a may enable receiving RF signals in a plurality of frequency bands in accordance with the wireless communications protocols that may be supported by the wireless terminal 150. Each frequency band supported by the RF receiver 153a may have a corresponding front-end circuit for handling low noise amplification and down conversion operations, for example. In this regard, the RF receiver 153a may be referred to as a multi-band receiver when it supports more than one frequency band. In another embodiment of the invention, the wireless terminal 150 may comprise more than one RF receiver 153a, wherein each of the RF receiver 153a may be a single-band or a multi-band receiver. The RF receiver 153a may be implemented on a chip. In an embodiment of the invention, the RF receiver 153a may be integrated with the RF transmitter 153b on a chip to comprise the RF transceiver 152, for example. In another embodiment of the invention, the RF receiver 153a may be integrated on a chip with more than one component in the wireless terminal 150.

The RF receiver 153a may quadrature down convert the received RF signal to a baseband frequency signal that comprises an in-phase (I) component and a quadrature (Q) component. The RF receiver 153a may perform direct down conversion of the received RF signal to a baseband frequency signal, for example. In some instances, the RF receiver 153a may enable analog-to-digital conversion of the baseband signal components before transferring the components to the digital baseband processor 159. In other instances, the RF receiver 153a may transfer the baseband signal components in analog form.

The digital baseband processor 159 may comprise suitable logic, circuitry, and/or code that may enable processing and/or handling of baseband frequency signals. In this regard, the digital baseband processor 159 may process or handle signals received from the RF receiver 153a and/or signals to be transferred to the RF transmitter 153b, when the RF transmitter 153b is present, for transmission to the network. The digital baseband processor 159 may also provide control and/or feedback information to the RF receiver 153a and to the RF transmitter 153b based on information from the processed signals. The digital baseband processor 159 may communicate information and/or data from the processed signals to the processor 155 and/or to the memory 157. Moreover, the digital baseband processor 159 may receive information from the processor 155 and/or to the memory 157, which may be processed and transferred to the RF transmitter 153b for transmission to the network. In an embodiment of the invention, the digital baseband processor 159 may be integrated on a chip with more than one component in the wireless terminal 150.

The RF transmitter 153b may comprise suitable logic, circuitry, and/or code that may enable processing of RF signals for transmission. The RF transmitter 153b may enable transmission of RF signals in a plurality of frequency bands. Each frequency band supported by the RF transmitter 153b may have a corresponding front-end circuit for handling amplification and up conversion operations, for example. In this regard, the RF transmitter 153b may be referred to as a multi-band transmitter when it supports more than one frequency band. In another embodiment of the invention, the wireless terminal 150 may comprise more than one RF transmitter 153b, wherein each of the RF transmitter 153b may be a single-band or a multi-band transmitter. The RF transmitter 153b may be implemented on a chip. In an embodiment of the invention, the RF transmitter 153b may be integrated with the RF receiver 153a on a chip to comprise the RF transceiver 152, for example. In another embodiment of the invention, the RF transmitter 153b may be integrated on a chip with more than one component in the wireless terminal 150.

The RF transmitter 153b may quadrature up convert the baseband frequency signal comprising I/Q components to an RF signal. The RF transmitter 153b may perform direct up conversion of the baseband frequency signal to a baseband frequency signal, for example. In some instances, the RF transmitter 153b may enable digital-to-analog conversion of the baseband signal components received from the digital baseband processor 159 before up conversion. In other instances, the RF transmitter 153b may receive baseband signal components in analog form.

The processor 155 may comprise suitable logic, circuitry, and/or code that may enable control and/or data processing operations for the wireless terminal 150. The processor 155 may be utilized to control at least a portion of the RF receiver 153a, the RF transmitter 153b, the digital baseband processor 159, and/or the memory 157. In this regard, the processor 155 may generate at least one signal for controlling operations within the wireless terminal 150. The processor 155 may also enable executing of applications that may be utilized by the wireless terminal 150. For example, the processor 155 may generate at least one control signal and/or may execute applications that may enable current and proposed WLAN communications in the wireless terminal 150.

The memory 157 may comprise suitable logic, circuitry, and/or code that may enable storage of data and/or other information utilized by the wireless terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the wireless terminal 150. For example, the memory 157 may comprise information necessary to configure the RF receiver 153a for receiving WLAN signals in the appropriate frequency band.

This invention may apply particularly to the analog signal processing of the RF receiver 153a.

Figure 1B:
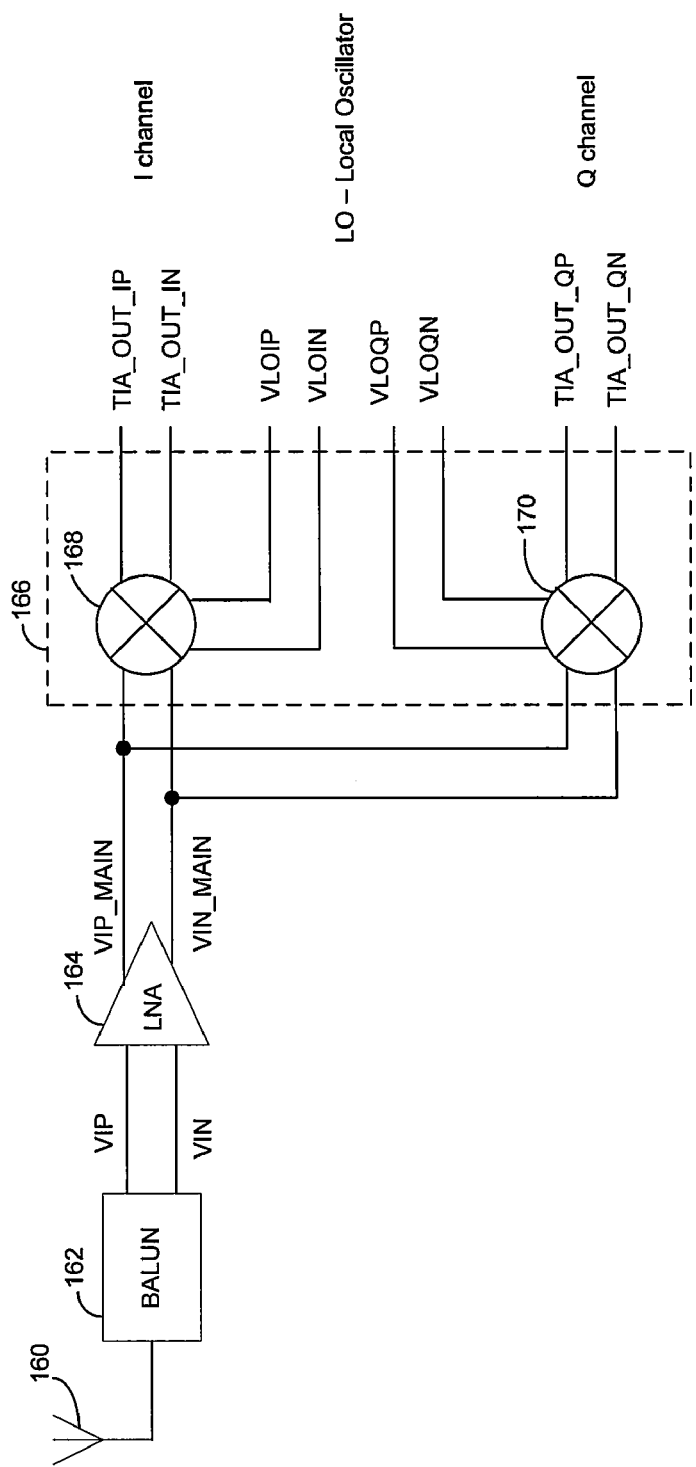
FIG. 1B is a block diagram illustrating an exemplary RF front-end architecture, in connection with an embodiment of the invention.

FIG. 1B is a block diagram illustrating an exemplary RF front-end architecture, in connection with an embodiment of the invention. Referring to FIG. 1B, there is shown an antenna 160, a balun 162, a low-noise amplifier 164 and a demodulator 166. The demodulator 166 may comprise the multipliers 168 and 170. There is also shown in FIG. 1B, the voltage signals VIP, VIN, VIP_MAIN, VIN_MAIN, TIA_OUT_IP, TIA$_{OUT}$_IN, TIA_OUT_QP, TIA_OUT_QN, VLOIP, VLOIN, VLOQP and VLOQN.

In wireless radio frequency communication systems, the received signal may comprise an information-carrying baseband signal that may be modulated onto a carrier frequency that may typically be much higher than the bandwidth of the baseband signal. Hence, at the RF receiver front end, it may be utilized to remove the information-carrying baseband signal from the carrier by demodulating the received signal. Furthermore, the received RF signal may comprise both an in-phase and a quadrature phase component. Since these two signal components may be processed in separate receiver chains, it may be necessary to separate the in-phase (I) channel from the quadrature (Q) channel.

The received signal may be captured at the antenna 160. The received signal may typically be an unbalanced signal and may therefore be fed into a balun 162 to be converted into a balanced signal for further processing. Balun is a word-construct based on bal-anced and un-balanced. Baluns are electromagnetic coupling devices in a wide variety of different possible implementations to achieve the conversion from a balanced signal to an unbalanced signal and vice versa.

A balanced line is a transmission line made up of two conductors that both carry a signal with reference to ground. The signals may be designed to minimize the interference they create together by designing them in such a way that their respective electromagnetic fields may cancel each other. For example, the signals may be chosen to be the inverse of each other. In addition, balanced signals are robust to interference since interference that may be experienced on both conductors, may be removed easily.

Hence, the balanced line output of the balun 162 given by the balanced signals VIP and VIN, may be fed into a low-noise amplifier 164 for amplification before further processing. The amplified signals VIP_MAIN and VIN_MAIN may then be fed to the demodulator 166, where the carrier may be removed and the I channel may be separated from the Q channel. The demodulation and separation of the signal may be achieved by multiplying the input signal given on VIP_MAIN and VIN_MAIN with the local oscillator signal given by the differential input VLOIP and VLOIN. Multiplication in the multiplier 168 may produce a balanced output signal for the I channel, on TIA_OUT_IP/TIA_OUT_IN and multiplication with a phase-shifted version of the local oscillator signal, that is VLOQP/VLOQN, in multiplier 170 may produce the Q channel.

The local oscillator frequency may be equal to the carrier frequency. In some systems, the demodulation may be achieved in two stages where the first demodulator will demodulate the signal to an intermediate frequency before a second demodulation stage may further demodulate the signal to generate a baseband signal. In FIG. 1B, the demodulator 166 may be enabled to use a demodulator frequency equal to the carrier frequency and may produce a baseband output signal for the I channel, given in TIA_OUT_IP/TIA_OUT_IN and the Q channel, given in TIA_OUT_QN/TIA_OUT_QP.

Figure 2:
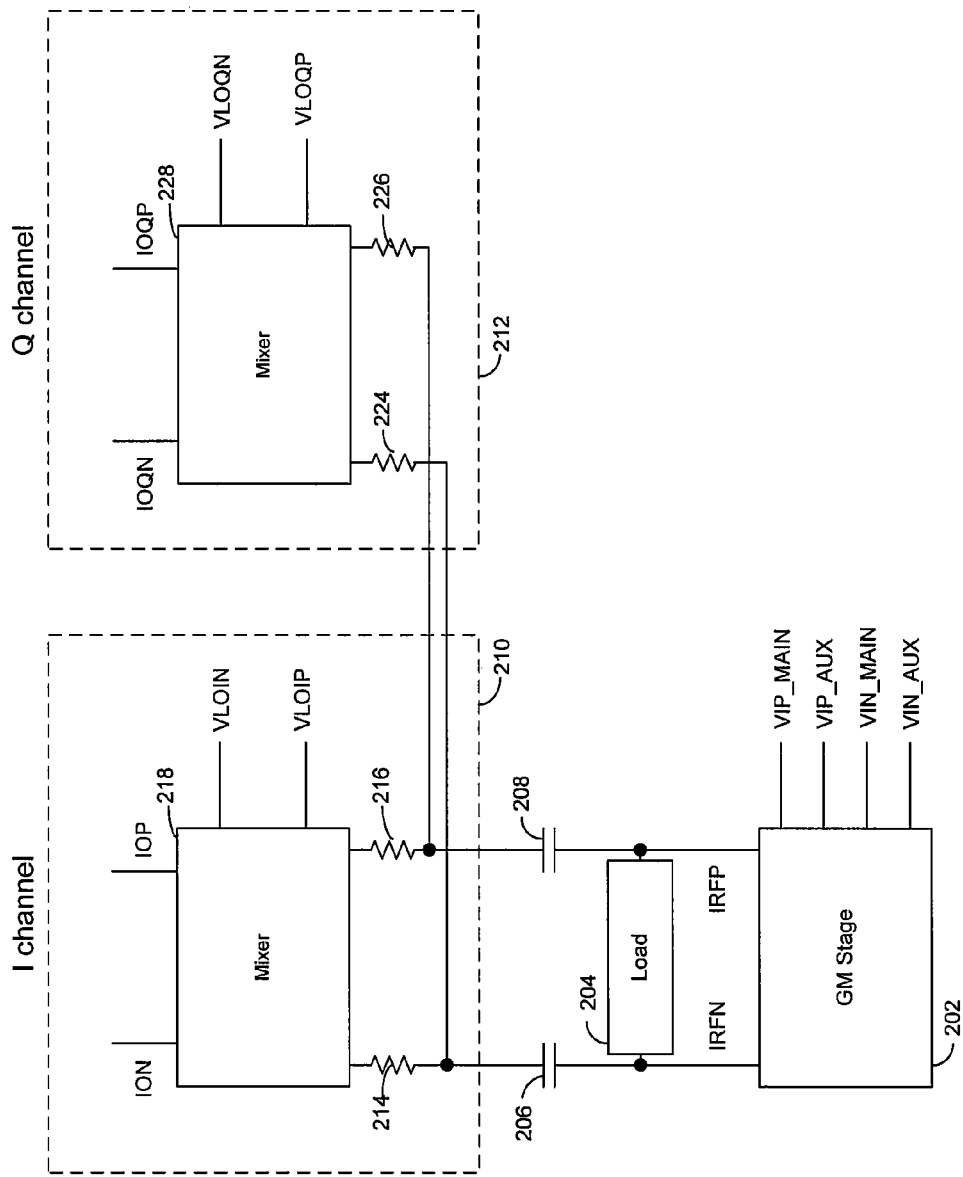
FIG. 2 is a block diagram illustrating an exemplary architecture of an in-phase channel processing chain and a quadrature channel processing chain with a shared GM stage, in connection with an embodiment of the invention.

FIG. 2 is a block diagram illustrating an exemplary architecture of an in-phase channel processing chain and a quadrature channel processing chain with a shared GM stage, in connection with an embodiment of the invention. Referring to FIG. 2, there is shown a GM stage 202, a load 204, coupling capacitors 206 and 208, and I channel processing block 210 and a Q channel processing block 212. The I channel processing block 210 may comprise isolation resistors 214 and 216, and a mixer block 218. The Q channel processing block 212 may comprise isolation resistors 224 and 226, and a mixer block 228. There is further shown in FIG. 2, input signals VIP_MAIN, VIN_MAIN, VIP_AUX, VIN_AUX, VLOIN, VLOIP, VLOQN and VLOQP, currents IRFN and IRFP and output currents ION, IOP, IOQP and IOQN. The in-phase channel processing chain and a quadrature channel processing chain with a shared GM stage may be utilized in the demodulator 166 illustrated in FIG. 1B.

The differential RF input signal VIP_MAIN/VIN_MAIN and the auxiliary GM stage linearization signals may be input to the GM stage 202. The differential output current IRFN/IRFP of the GM stage 202 may be fed to the load 204. One terminal of the capacitor 206 may be coupled to the IRFN terminal of the load 204. The other terminal of the capacitor 206 may be coupled to the resistors 214 and 224. The other terminal of the resistor 214 may be coupled to the mixer 218. The other terminal of resistor 224 may be coupled to the mixer 228. One terminal of the capacitor 208 may be coupled to the IRFP terminal of the load 204. The other terminal of the capacitor 208 may be coupled to the resistors 216 and 226. The other terminal of the resistor 216 may be coupled to the mixer 218. The other terminal of the resistor 226 may be coupled to the mixer 228. The differential local oscillator signal VLOIN/VLOIP may be fed into the mixer 218 and the differential output currents of mixer 218 may be ION/IOP. The differential local oscillator signal VLOQN/VLOQP may be fed into the mixer 228 and the differential output currents of mixer 228 may be IOQN/IOQP.

The I channel may be separated from the Q channel by multiplying the received signal with the local oscillator signal and a phase-shifted local oscillator signal, respectively, as explained for FIG. 1B. From FIG. 2, it may be observed that the operations of the I channel processing and the Q channel processing may be identical until the currents IRFN/IRFP enter the processing blocks 210 and 212, respectively. Hence, various embodiments of the invention utilize a common GM stage 202, inductive load 204 and coupling capacitors 206 and 208 instead of two entire processing chains where both the I channel and the Q channel each comprise a GM stage and a load. This may reduce the area needed to implement the circuit in an integrated circuit significantly, in particular, because one of the load blocks comprising inductors may be omitted.

However, in instances where a common GM stage 202 may be used, there may be leakage of the local oscillator signal VLOIN/VLOIP from the I channel mixer 218 into the inputs of the Q channel mixer 228 and leakage of the phase-shifted local oscillator signal VLOQP/VLOQN from the Q channel mixer 228 into the inputs of the I channel mixer 218. Accordingly, in various embodiments of the invention, the mixer 218 may be isolated from the mixer 228 as illustrated in FIG. 2, by introducing small isolation resistors 214, 216, 224 and 226 into the signal path. The isolation resistors may be small in order to minimally load the input signal to the mixers 218 and 228, while sufficiently reducing the oscillator leakage out of the mixers. The noise figure of the demodulator circuit may degrade due to the isolation resistors 214, 216, 224 and 226.

Figure 3:
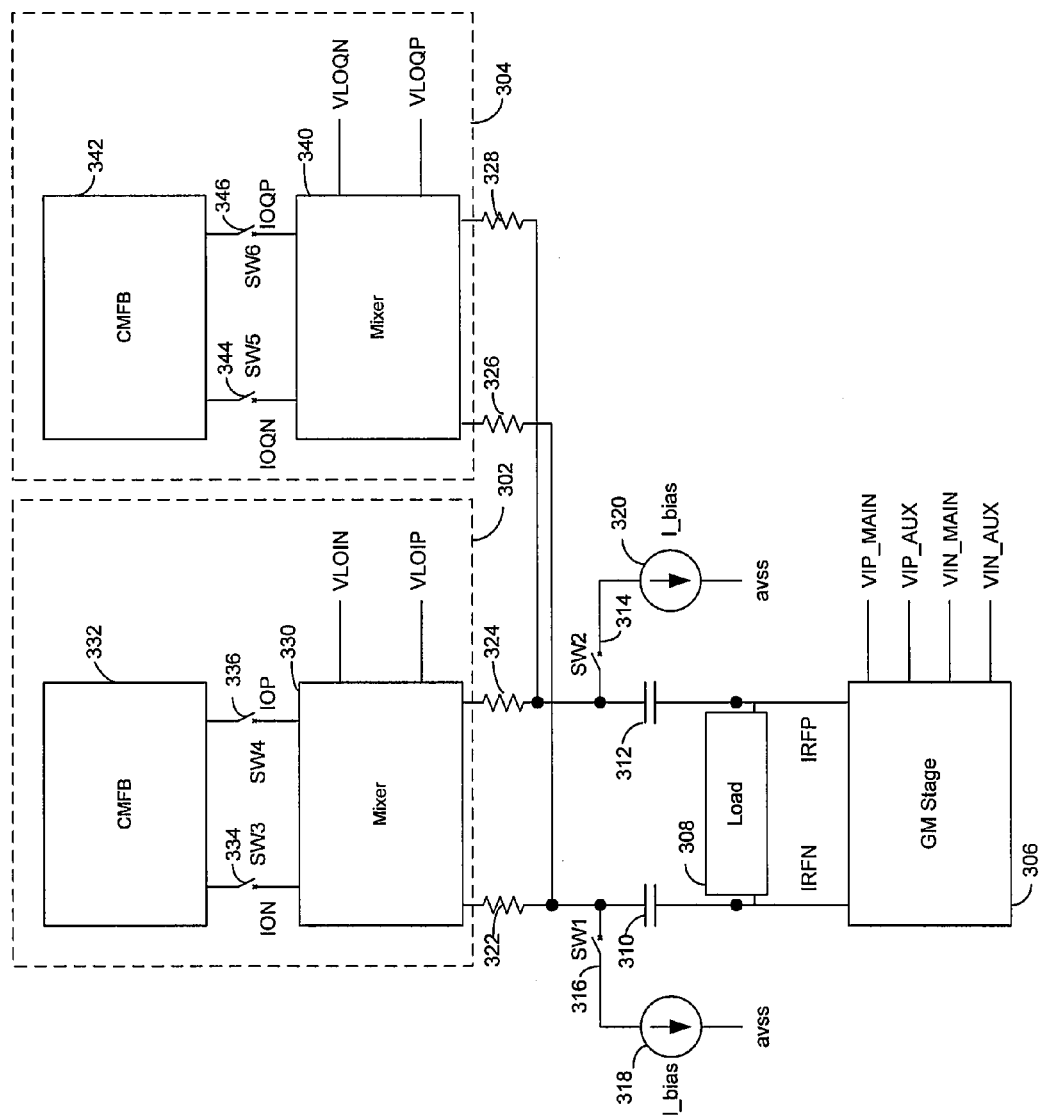
FIG. 3 is a block diagram illustrating an exemplary active mixer architecture, in accordance with an embodiment of the invention.

FIG. 3 is a block diagram illustrating an exemplary active mixer architecture, in accordance with an embodiment of the invention. Referring to FIG. 3, there is shown a GM stage 306, a load 308, coupling capacitors 310 and 312, current sources 318 and 320, switches 314 and 316, isolation resistors 322, 324, 326 and 328, and active mixer blocks 302 and 304. The active mixer block 302 may comprise a passive mixer 330, a common-mode feedback (CMFB) block 332 and switches 334 and 336. The active mixer block 304 may comprise a passive mixer 340, a common-mode feedback (CMFB) block 342 and switches 344 and 346. There is also shown in FIG. 3, the voltage signals VIP_MAIN, VIN_MAIN, VIP_AUX, VIN_AUX, VLOIN, VLOIP, avss, VLOQP and VLOQN, and the current signals I_bias, IRFN, IRFP, ION, IOP, IOQN and IOQP.

The differential RF input signal VIP_MAIN/VIN_MAIN and the auxiliary GM stage linearization signals may be input to the GM stage 306. The differential output current IRFN/IRFP of the GM stage 306 may be fed to the load 308. One terminal of the capacitor 310 may be coupled to the IRFN terminal of the load 308. The other terminal of the capacitor 310 may be coupled to the resistors 322 and 326 and switch SW1 316. The other terminal of the resistor 322 may be coupled to the mixer 330. The other terminal of resistor 326 may be coupled to the mixer 340. The other terminal of switch SW1 316 may be coupled to current source 318. The other terminal of current source 318 may be coupled to avss. One terminal of the capacitor 312 may be coupled to the IRFP terminal of the load 308. The other terminal of the capacitor 312 may be coupled to the resistors 324 and 328 and switch SW2 314. The other terminal of the resistor 324 may be coupled to the mixer 330. The other terminal of the resistor 328 may be coupled to the mixer 340. The other terminal of switch SW2 314 may be connected to current source 320. The other terminal of current source 320 may be coupled to avss. The differential local oscillator signal VLOIN/VLOIP may be fed into the mixer 330 and the differential output currents of mixer 330 may be ION/IOP. ION may be coupled to switch SW3 334. The other terminal of switch SW3 334 may be coupled to the CMFB block 332. IOP may be coupled to switch SW4 336. The other terminal of switch SW4 336 may be coupled to the CMFB block 332. The differential local oscillator signal VLOQN/VLOQP may be fed into the mixer 340 and the differential output currents of mixer 340 may be IOQN/IOQP. IOQN may be coupled to switch SW5 344. The other terminal of switch SW5 344 may be coupled to the CMFB block 342. IOQP may be coupled to switch SW6 346. The other terminal of switch SW6 346 may be coupled to the CMFB block 342.

The active mixer architecture, illustrated in FIG. 3, may improve the performance of the demodulator 166, which is illustrated in FIG. 1B. For example, the amplitude of the local generator inputs VLOIN/VLOIP and VLOQN/VLOQP may be reduced in the active architecture of FIG. 3, compared to the passive architecture illustrated in FIG. 2, while maintaining the same performance. This may result in substantial power savings at the local oscillator generation circuit. Furthermore, because the amplitude of the local oscillator signals VLOIN/VLOIP and VLOQN/VLOQP may be reduced, there may be less leakage of the oscillator signal from the I channel mixer 330 into the Q channel mixer 340 and vice versa. On the other hand, the noise figure of the passive mixer illustrated in FIG. 2, may be less than for the active mixer illustrated in FIG. 3, especially at lower baseband frequencies, due to lower flicker noise. This may be because the passive mixer may be running with no DC current through its core devices. With this scheme, a multi-standard direct conversion or low-IF optimal mixer may be implemented, in which, for narrow bandwidth modulations, the passive mixer with lower flicker noise may be used, but for wideband modulations the active mixer may be used.

Comparing FIG. 2 with FIG. 3, mixer 218 may correspond to the passive mixer 330 and mixer 228 may correspond to passive mixer 340, respectively. By adding a bias current I_bias via switches SW1 316 and SW2 314, and a common-mode feedback block 332 to the I channel processing chain and a common-mode feedback block 342 to the Q channel processing chain, the passive mixer blocks 330 and 340 may be transformed into active mixers 302 and 304, respectively. The exemplary active mixer structure of FIG. 3 may be switched from active to passive mode by opening switches SW1 316, SW2 314, SW3 334, SW4 336, SW5 344 and SW6 346, reverting the architecture to the exemplary embodiment illustrated in FIG. 2.

Figure 4:
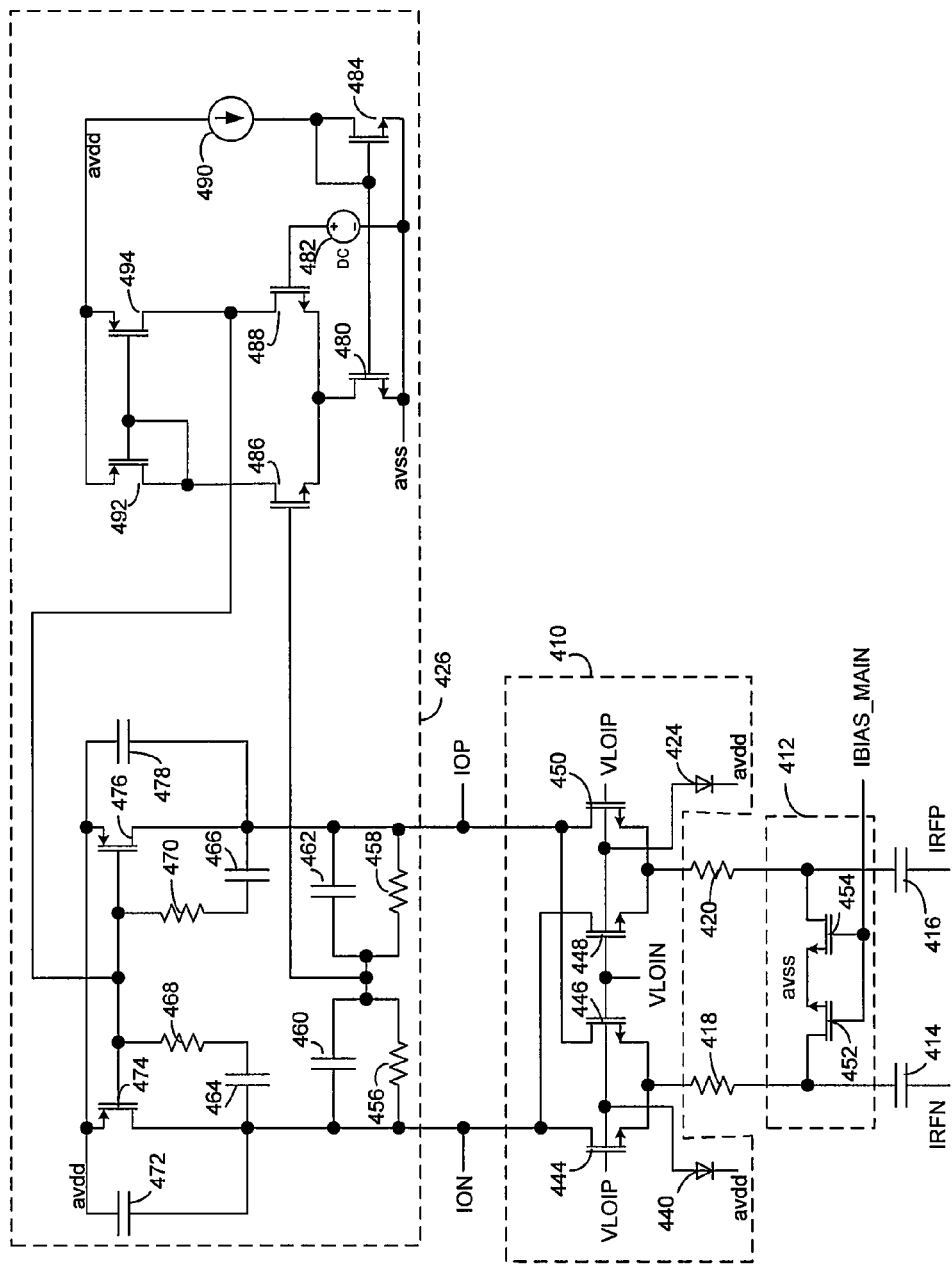
FIG. 4 is a diagram illustrating an exemplary embodiment of an active mixer, according to an embodiment of the invention.

FIG. 4 is a circuit diagram illustrating an exemplary embodiment of an active mixer, according to an embodiment of the invention. Referring to FIG. 4, there is shown coupling capacitors 414 and 416, a biasing block 412, isolation resistors 418 and 420, a passive mixer 410 and a common-mode feedback block 426. The biasing block 412 may comprise MOSFETs 452 and 454. The passive mixer 410 may comprise diodes 440 and 424, MOSFETs 444, 446, 448 and 450. The common-mode feedback block 426 may comprise resistors 456, 458, 468 and 470, capacitors 460, 462, 464, 466, 472 and 478, current source 490, voltage source 482 and MOSFETs 474, 476, 480, 484, 486, 488, 492 and 494. There is also shown in FIG. 4, input currents IRFN, IRFP and IBIAS_MAIN, and output currents ION and IOP, supply voltages avdd and avss, and local oscillator inputs VLOIP and VLOIN.

The biasing block 412 comprising MOSFETs 452 and 454 may correspond to the switches SW1 316 and SW2 314, illustrated in FIG. 3, respectively. Isolation resistors 418 and 420 may correspond to isolation resistors 322 and 324 illustrated in FIG. 3, respectively. The passive mixer 410 illustrates an exemplary embodiment of the mixer 330, illustrated in FIG. 3. The common-mode feedback block 426 may correspond to an exemplary embodiment of the common-mode feedback block 332, illustrated in FIG. 3.

The differential currents IRFN may be fed to capacitor 414. The other terminal of capacitor 414 may be coupled to the drain of MOSFET 452. IRFP may be fed to capacitor 416. The other terminal of capacitor 416 may be coupled to the drain of MOSFET 454. The gates of MOSFETs 452 and 454 may be coupled to IBIAS_MAIN. One terminal of resistor 418 may be coupled to the drain of MOSFET 452. The other terminal of resistor 418 may be coupled to the source of MOSFETs 444 and 446. The drain of MOSFET 444 may be coupled to the drain of MOSFET 448 and the drain of MOSFET 446 may be coupled to the drain of MOSFET 450. The substrate of MOSFETs 444 and 446 may be coupled to a diode 440. The other terminal of the diode 440 may be connected to avdd. One terminal of resistor 420 may be coupled to the drain of MOSFET 454. The other terminal of resistor 420 may be coupled to the sources of MOSFETs 448 and 450.

The substrates of MOSFETs 448 and 450 may be coupled to the diode 424. The other terminal of diode 424 may be coupled to avdd. The gates of MOSFETs 444 and 450 may be coupled to VLOIP and the gates of MOSFETs 446 and 448 may be coupled to VLOIN. One terminal of resistor 456 may be coupled to the drain of MOSFET 444 and the drain of MOSFET 474. The other terminal may be connected to the gate of MOSFET 486.

The gate of MOSFET 486 may also be coupled to one terminal of capacitors 460 and 462 and resistors 456 and 458. The other terminal of resistor 458 may be coupled to the drain of MOSFET 450 and the drain of MOSFET 476. The other terminal of capacitor 460 may be coupled to the drain of MOSFET 474. The other terminal of capacitor 462 may be coupled to the drain of MOSFET 476. One terminal of the capacitor 472 may be coupled to the drain of MOSFET 474, while the other terminal of capacitor 472 may be coupled to the source of MOSFET 474. The gate of MOSFET 474 may be coupled to one terminal of resistors 468 and 470 and the gate of MOSFET 476 and the drain of MOSFET 494. The other terminal of resistor 468 may be coupled to capacitor 464. The other terminal of capacitor 464 may be coupled to the drain of MOSFET 474. The other terminal of resistor 470 may be coupled to capacitor 466. The other terminal of capacitor 466 may be coupled to the drain of MOSFET 476 and capacitor 478. The other terminal of capacitor 478 may be coupled to the sources of MOSFETs 474 and 476, which may be coupled to avdd.

The source of MOSFET 494 may be coupled to the source of MOSFET 492 and to avdd. The gate of MOSFET 494 may be coupled to the gate and drain of MOSFET 492. The drain of MOSFET 492 may also be coupled to the drain of MOSFET 486. The source of MOSFET 486 may be coupled to the source of MOSFET 488 and the drain of MOSFET 480. The drain of MOSFET 488 may be coupled to the drain of MOSFET 494. The gate of MOSFET 488 may be coupled to the positive terminal of voltage source 482. The negative terminal of voltage source 482 may be coupled to avss. The source of MOSFET 480 may be coupled to avss. The gate of MOSFET 480 may be coupled to the gate of MOSFET 484. The gate of MOSFET 484 may also be coupled to its drain and to one terminal of the current source 490. The other terminal of the current source 490 may be coupled to avdd. The source of MOSFET 484 may be connected to avss. The biasing block 412 may be used to switch the active mixer structure between passive and active operation mode.

Figure 5:
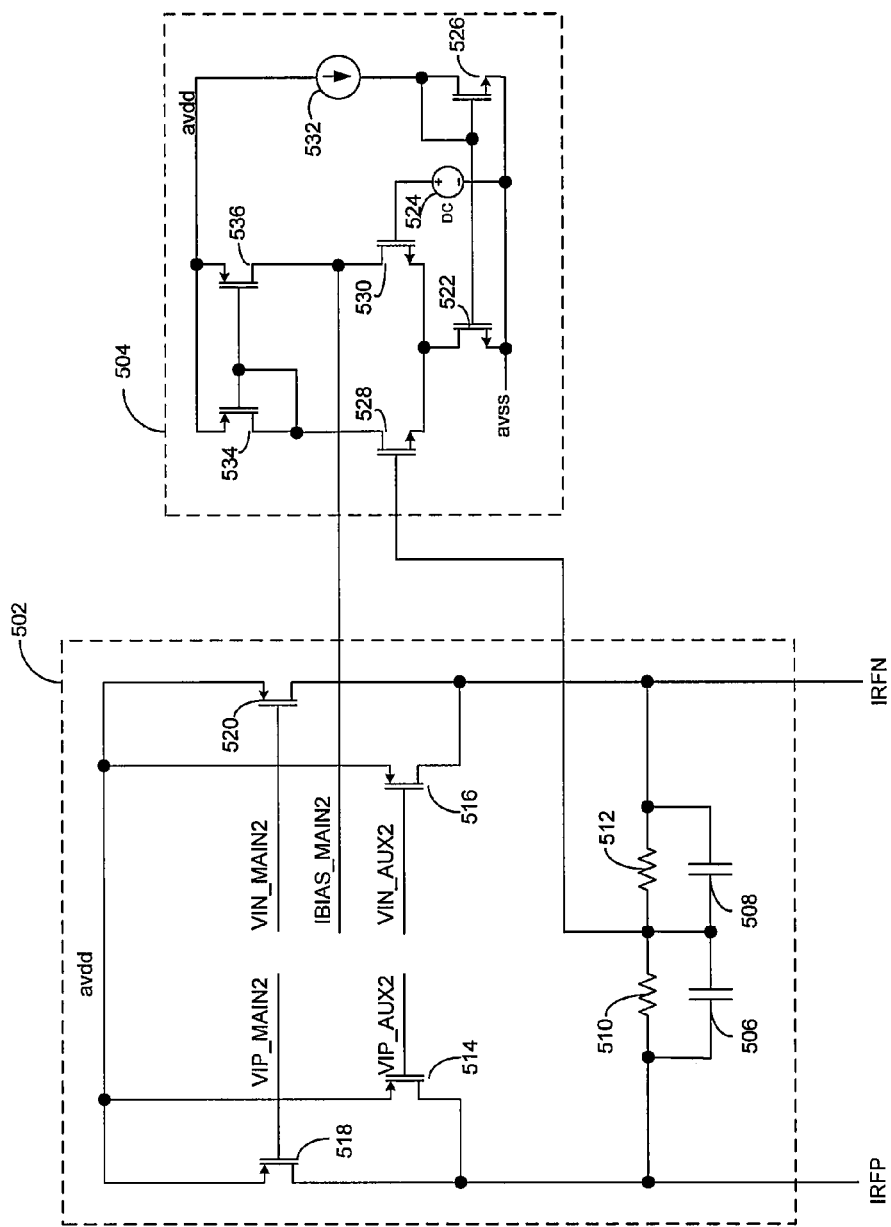
FIG. 5 is a diagram illustrating an exemplary active load, in accordance with an embodiment of the invention.

FIG. 5 is a diagram illustrating an exemplary active load, in accordance with an embodiment of the invention. Referring to FIG. 5, there is shown a load block 502 and a common-mode feedback block 504. The load block 502 may comprise capacitors 506 and 508, resistors 510 and 512, and MOSFETs 514, 516, 518 and 520. The common-mode feedback block 504 may comprise a voltage source 524, a current source 532 and MOSFETs 522, 526, 528, 530, 534 and 536. There is also shown in FIG. 5, input currents IRFP and IRFN, voltage inputs VIP_MAIN2, VIN_MAIN2, IBIAS_MAIN2, VIP_AUX2 and VIN_AUX2, and supply voltages avdd and avss.

One terminal of resistor 510 and capacitor 506 may be coupled to IRFP. The other terminal of resistor 510 may be coupled with the other terminal of capacitor 506 and one terminal of resistor 512 and capacitor 508 and the gate of MOSFET 528. The other terminal of resistor 512 and capacitor 508 may be coupled to IRFN. The gate of MOSFET 514 may be coupled to VIP_AUX2, the drain of MOSFET 514 may be coupled to IRFP and the source of MOSFET 514 may be coupled to avdd. The gate of MOSFET 518 may be coupled to VIP_MAIN2, the drain of MOSFET 518 may be coupled to IRFP and the source of MOSFET 518 may be coupled to avdd. The gate of MOSFET 516 may be coupled to VIN_AUX2, the drain of MOSFET 516 may be coupled to IRFN and the source of MOSFET 516 may be coupled to avdd.

The gate of MOSFET 520 may be coupled to VIN_MAIN2, the drain of MOSFET 520 may be coupled to IRFN and the source of MOSFET 520 may be coupled to avdd. The drain of MOSFET 528 may be coupled to the drain and gate of MOSFET 534 and the gate of MOSFET 536. The sources of MOSFETs 534 and 536 may be coupled to avdd. The drain of MOSFET 536 may be coupled to the drain of MOSFET 530 and IBIAS_MAIN2. The sources of MOSFETs 528 and 530 may be coupled to the drain of MOSFET 522. The source of MOSFET 522 may be coupled to avss. The gate of MOSFET 522 may be coupled to the gate and drain of MOSFET 526. The source of MOSFET 526 may be coupled to avss. The positive terminal of the voltage source 524 may be coupled to the gate of MOSFET 530 and the negative terminal of the voltage source 524 may be coupled to avss. One terminal of the current source 532 may be coupled to avdd and the other terminal of the current source 532 may be coupled to the drain of MOSFET 526.

The exemplary circuit illustrated in FIG. 5 may be used to replace the inductive load 308 in FIG. 3. Since inductors may require large die areas, it may be advantageous to replace the inductors with an active load. Such an architecture may save die area and may also provide a more constant load over a large band of operating frequencies, that is, wideband operation. The common-mode feedback block 504 may be utilized to provide stable biasing of the active load 502.

In accordance with an embodiment of the invention, a method and system for configurable Active/Passive Mixer 330 and 340, and Shared GM Stage 306 may comprise configuring an RF mixer 168 and 170 in frequency demodulator 166, as shown in FIG. 1B, to operate in an active mode or a passive mode. An in-phase (I) processing block 302 and a quadrature (Q) processing block 304 of the RF mixer 330 and 340 may utilize a single shared GM stage 306. One or more switches 314, 316, 334, 336, 344 and 346 may be activated to enable the active mode or the passive mode of operation for the RF mixers 330 and 340.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communications system the method comprising:
   configuring, by a processor in a wireless communication device, an RF mixer in a frequency demodulator to operate in an active mode or a passive mode, said RF mixer comprising separate in-phase and quadrature mixer stages; and
   sharing a single transconductance stage by said separate in-phase and quadrature mixer stages of said RF mixer, wherein said active mode is configured by selectively coupling a common-mode feedback block to outputs of each of said separate in-phase and quadrature mixer stages and selectively coupling an active load between said single shared transconductance stage and said separate in-phase and quadrature mixer stages.

2. The method according to claim 1, comprising converting said in-phase and quadrature mixer stages of said RF mixer in said frequency demodulator from a passive configuration to an active configuration.

3. The method according to claim 1, comprising activating one or more switches to enable said active mode or said passive mode of operation for said RF mixer.

4. The method according to claim 1, comprising processing wideband modulated signals when said frequency demodulator is configured to operate in said active mode.

5. The method according to claim 1, comprising processing narrowband modulated signals when said frequency demodulator is configured to operate in said passive mode.

6. A system for processing signals in a communications system, the system comprising:
   one or more circuits that configures an RF mixer in a frequency demodulator to operate in an active mode or a passive mode, said RF mixer comprising separate in-phase and quadrature mixer stages; and
   a single transconductance stage that is shared by said in-phase and said quadrature mixer stages of said RF mixer, wherein said active mode is configured by selectively coupling a common-mode feedback block to outputs of each of said separate in-phase and quadrature mixer stages and selectively coupling an active load between said single shared transconductance stage and said separate in-phase and quadrature mixer stages.

7. The system according to claim 6, wherein said one or more circuits enables conversion of said in-phase and quadrature mixer stages of said RF mixer in said frequency demodulator from a passive configuration to an active configuration.

8. The system according to claim 6, wherein said one or more circuits activates one or more switches to enable said active mode or said passive mode of operation for said RF mixer.

9. The system according to claim 6, comprising processing wideband modulated signals when said frequency demodulator is configured to operate in said active mode.

10. The system according to claim 6, comprising processing narrowband modulated signals when said frequency demodulator is configured to operate in said passive mode.

* * * * *